US008674545B2

(12) United States Patent
Signorelli et al.

(10) Patent No.: US 8,674,545 B2
(45) Date of Patent: Mar. 18, 2014

(54) LOW ON-RESISTANCE MOSFET IMPLEMENTED, BY-PASS DIODE OR CIRCUIT BREAKER AND RELATED SELF-POWERING AND CONTROL CIRCUIT

(75) Inventors: Tiziana Teresa Signorelli, Aci Bonaccorsi (IT); Francesco Pulvirenti, Acireale (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 517 days.

(21) Appl. No.: 13/096,393

(22) Filed: Apr. 28, 2011

(65) Prior Publication Data
US 2011/0278955 A1    Nov. 17, 2011

(30) Foreign Application Priority Data
May 14, 2010   (IT) .............................. VA2010A0042

(51) Int. Cl.
*H02J 1/00*   (2006.01)
(52) U.S. Cl.
USPC .......................................................... 307/61
(58) Field of Classification Search
USPC .......................................................... 307/61
See application file for complete search history.

(56) References Cited

U.S. PATENT DOCUMENTS

| 2008/0198523 A1 | 8/2008 | Schmidt et al. ................. 361/88 |
| 2009/0014050 A1 | 1/2009 | Haaf ............................ 136/244 |
| 2010/0002349 A1 | 1/2010 | La Scala et al. ................ 361/90 |

FOREIGN PATENT DOCUMENTS

WO    WO2006/079503    3/2006 ............. H01I 27/142

*Primary Examiner* — Robert L. Deberadinis
(74) *Attorney, Agent, or Firm* — Allen, Dyer, Doppelt, Milbrath & Gilchrist, P.A.

(57) ABSTRACT

A MOSFET implemented self-powered current by-pass or circuit breaker device is based on the use of a high multiplication factor (HMF) inductive voltage booster, adapted to boost a voltage as low as few tens of mV up to several Volts, assisted by a start-up low multiplication factor (LMF) charge pump made with low threshold transistors for providing a supply voltage to a polarity inversion detecting comparator of the drain-to-source voltage difference of a power MOSFET connected in parallel to a DC source or string of series connected DC sources or battery, in series to other DC sources during normal operation of the parallel connected DC source or string of series connected DC sources or battery. The inductance for the high multiplication factor, inductive voltage booster for most of the considered power applications is on the order of a few pH and such a relatively send inductor may be included as a discrete component in a compact package or "system-in-package" of monolithically integrated circuits.

18 Claims, 2 Drawing Sheets

LOW ON-RESISTANCE MOSFET IMPLEMENTED, BY-PASS DIODE OR CIRCUIT BREAKER AND RELATED SELF-POWERING AND CONTROL CIRCUIT

FIELD OF THE INVENTION

The present invention generally relates to integrated circuits for supplying and controlling a low conduction resistance MOSFET to efficiently function as a by-pass diode or as a safety reverse polarity circuit breaker in a photovoltaic conversion system or similar multiple DC sources power distribution network and battery powered systems.

BACKGROUND OF THE INVENTION

In a photovoltaic (PV) conversion system using multicellular solar panels, optimization of power yield under varying conditions of illumination of generally series connected strings of photovoltaic cells, imposes deployment of a way for automatically by-passing strings of series connected cells that are momentarily shadowed or blinded. Momentarily blinded or failed cells do not generate any electricity and are not conductive, thus other series connected illuminated cells may produce a voltage condition across one or several cells of the string that may momentarily be shadowed or practically blinded, which may cause a voltage breakdown and irreversible damage of the shadowed cells. Moreover, one or more faulty or blinded cells of a string may subtract the contribution to the overall power yield of a large number of other illuminated cells of the panel. In large multi-panel installations, a similar requirement of automatic by-passing blinded or faulty conversion units may apply to a whole module of strings or to a single panel of a plurality of panels connected in series, as schematically depicted in FIG. 1.

On another account, in DC power distribution networks including several distinct DC power sources the outputs of which are connected in parallel to a system DC load bus, the individual power converters (which may even be photovoltaic cell panels or other photovoltaic conversion device) may be controlled in a current sharing and/or hot swapping mode by a dedicated control circuit. Each of them normally has a circuit breaker device for interrupting the connection of any faulty DC power source to the DC load bus of the system.

Finally in battery powered systems, it cannot be excluded the possibility that the supply battery polarity be inadvertently reversed. As a safety measure against the risk of damaging the battery powered integrated circuit in case of accidental inversion of the polarity of the battery, a reverse bias protection device is introduced between the battery and the powered integrated circuitry, as schematically depicted in FIG. 2.

A known approach is to install inside the so-called junction box of the PV panel, Schottky diodes connected in parallel to strings of PV cells in series of the multicell panel that are often connected in series or in a series-parallel scheme to the positive and negative terminals of the panel, for providing an alternative path to the flow of electrical current, by-passing the string of PV cells. The current generated by illuminated strings of series connected cells eventually by-passes any string of series connected cells, some or all of which may be shadowed or "blinded", by flowing through the by-pass Schottky diode of the string of shadowed cells, to permit delivery of output power by the panel that otherwise could be prevented. In these conditions a significantly large power loss occurs in the conducting by-pass diode for as long as the shadowing continues and the diode may heat up considerably during exceptionally long lasting shadowing of the cells of the related string.

WO 2006/079503 A2 discloses the use of a controlled electronic switching device, preferably including a pair of MOSFETs, which is normally nonconductive when the related string of PV cells in series are illuminated and generating an electric current. In case of partial or total shadowing of the string of PV cells, the voltage that is produced at the two terminals of the controlled electronic switching device is exploited to charge a capacitor through a discrete inductive supply circuit. As long as the voltage on the capacitor remains above a certain value, the electronic switching device is kept on, otherwise it is off, allowing the capacitor to be eventually recharged. The charge of the capacitor is controlled by a dedicated commercial voltage regulating IC.

US 2008/0198523-A1 discloses the use of a single MOSFET in place of the by-pass diode, of a discrete inductive supply circuit and of a control and drive circuitry of the by-pass MOSFET. The switching on/off of the MOSFET during a period of shadowing of series connected PV cells of the related string is controlled in a cycling fashion by a timing circuit. Compared to other known approaches, the power loss in the by-pass MOSFET is reduced to a few Watts (about 1W for a current of 15A) depending on the actual duty cycle of the by-pass MOSFET.

US 2010/002349-A1 discloses a monolithic integration of a by-pass power MOSFET controlled by a circuit powered through an integrated charge-pump circuit employing an oscillator and an array of integrated capacitors. Due to leakage, the output voltage of the charge pump slowly decays, therefore the MOSFET is periodically switched off and the accumulated charge restored. During shadowing conditions of PV cells of the related string, the by-pass MOSFET is cyclically switched on/off under the control of a hysteresis comparator circuit that monitors the output voltage of the charge pump circuit.

Notwithstanding the possible advantages over the use of a Schottky diode, there is still a significant power loss during shadowing phases of related PV cells due to the on/off switching of the MOSFET, in practice tied to the off time phases of the by-pass MOSFET. Proposals for eliminating the need for off-time intervals have the drawback of requiring burdensome charge pump circuits employing numerous relatively large discrete capacitors difficult to embed in a system-in-package device of desirably reduced size.

In terms of utility, it should be clear to those skilled in the art that a current by-pass power device may be deployed for optimizing overall power yield from the single multicellular PV panel as well as for optimizing overall power yield from a multipanel PV generation plant including strings of series connected PV panels or alternative PV conversion units, for eventually by-passing any or all panels or units of an affected string of series connected panels or similar units.

Notwithstanding that the above review of the state of the art refers to the function of a current by-pass power device and refers to utility in the architecture of a PV multi-cell panel generation panels, the by-pass device may have the same utility even for DC power distribution networks that include a plurality of series connected power sources (e.g. batteries) any of which may accidentally fail or be momentarily deactivated, and in battery powered systems.

SUMMARY OF THE INVENTION

It is an object of the invention to provide a more effective current by-pass power diode useful in photovoltaic panel conversion systems or similar DC power distribution networks, as well as a polarity inversion safety circuit breaker in battery powered systems, that could be fabricated in a compact highly reliable system-in-package form.

The present device is based on the use of a high multiplication factor (HMF) inductive voltage booster, adapted to boost a voltage as low as few tens of mV up to several Volts, assisted by a start-up low multiplication factor (LMF) charge pump made with low threshold transistors for providing a supply voltage to a polarity inversion detecting comparator of the drain-to-source voltage difference of a power MOSFET connected in parallel to a DC source or string of series connected DC sources or battery, in series to other DC sources during normal operation of the parallel connected DC source or string of series connected DC sources or battery.

It has been found that the inductance required by the high multiplication factor inductive voltage booster for most of the considered power applications is on the order of few µH and such a relatively minute inductor may be included as a discrete component in a compact package (according to a common "system-in-package" fabrication technique) of monolithically integrated circuits. Start-up self-supplying circuits including an LMF charge pump, a polarity inversion detector comparator circuit, common clock phase generation circuits and driver stage of an inductive voltage booster circuit, utilizing a discrete in-package inductor, are monolithically integrated and the inductor is connected to dedicated pads of the integrated circuit chip. The integrated circuit includes enabling circuitry of the inductive voltage booster and a self-powering line to the comparator circuit supply node from the output of the inductive voltage booster.

The power switching MOSFET, the current terminals of which are connected to a cell string or unitary DC source of a series of such strings or unitary DC sources, and a gate terminal of which is directly connected to the output of the inductive voltage booster, may be a discrete component of the system-in-package device or may be integrated on the same chip of the self powered, integrated control circuit.

The integrated circuit includes a start-up low multiplication factor charge pump of a negative drain/source voltage difference on the current terminals of the MOSFET caused by a current interruption within the string or unitary DC source series connected to other DC sources, supplying a reverse polarity comparator that enables the high multiplication factor, inductive voltage booster of the same negative drain/source voltage difference on the current terminals of the by-pass MOSFET, using at least an in-package discrete inductor, the output voltage of which is applied to the gate of the MOSFET for keeping it in conduction for as long as a negative drain/source voltage difference is sensed by the comparator. The start-up low multiplication factor charge pump ceases to work as soon as the negative drain/source voltage difference falls down to the voltage drop over the $R_{DS}$ of the conducting MOSFET and thereafter the supply voltage to the comparator and to the high multiplication factor inductive voltage booster is derived though a diode from the output voltage of the inductive booster itself.

BRIEF DESCRIPTION OF THE DRAWINGS

Specific implementing aspects and advantages of the invention will become even more evident through the following detailed description of exemplary embodiments made with reference to the attached drawings, wherein.

DETAILED DESCRIPTION OF THE PREFERRED EMBODIMENTS

Figure 1:
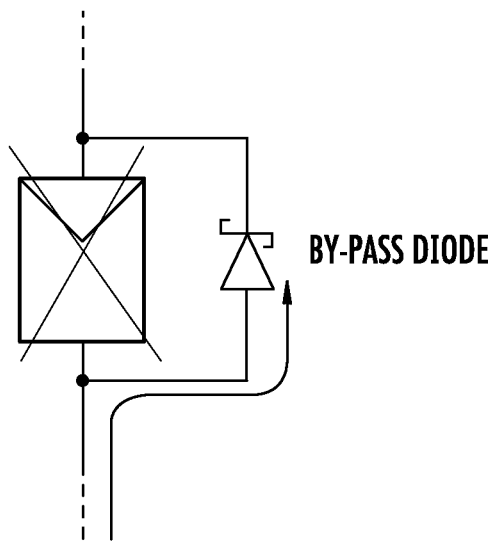
FIG. 1 is a schematic diagram illustrating the principle of by-passing a possibly shadowed PV module connected in series to other similar modules that remain illuminated in accordance with the prior art.
Figure 2:
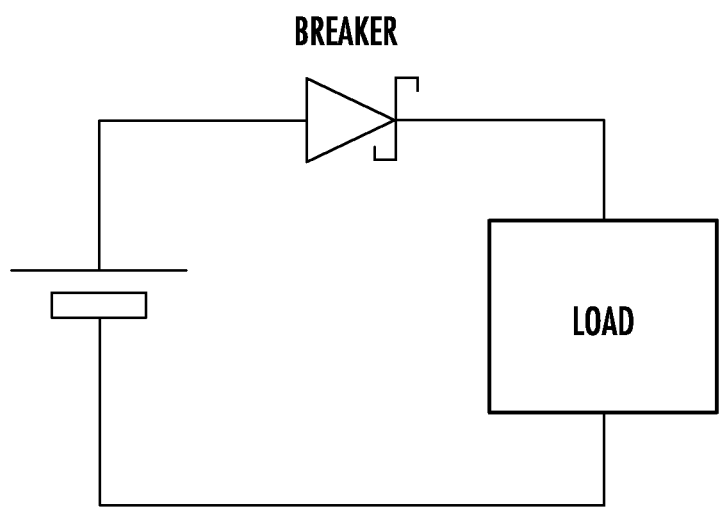
FIG. 2 is a schematic diagram illustrating the principle of interrupting the supply to a battery powered circuit in the case of a polarity inversion of the battery, in accordance with the prior art.
Figure 3:
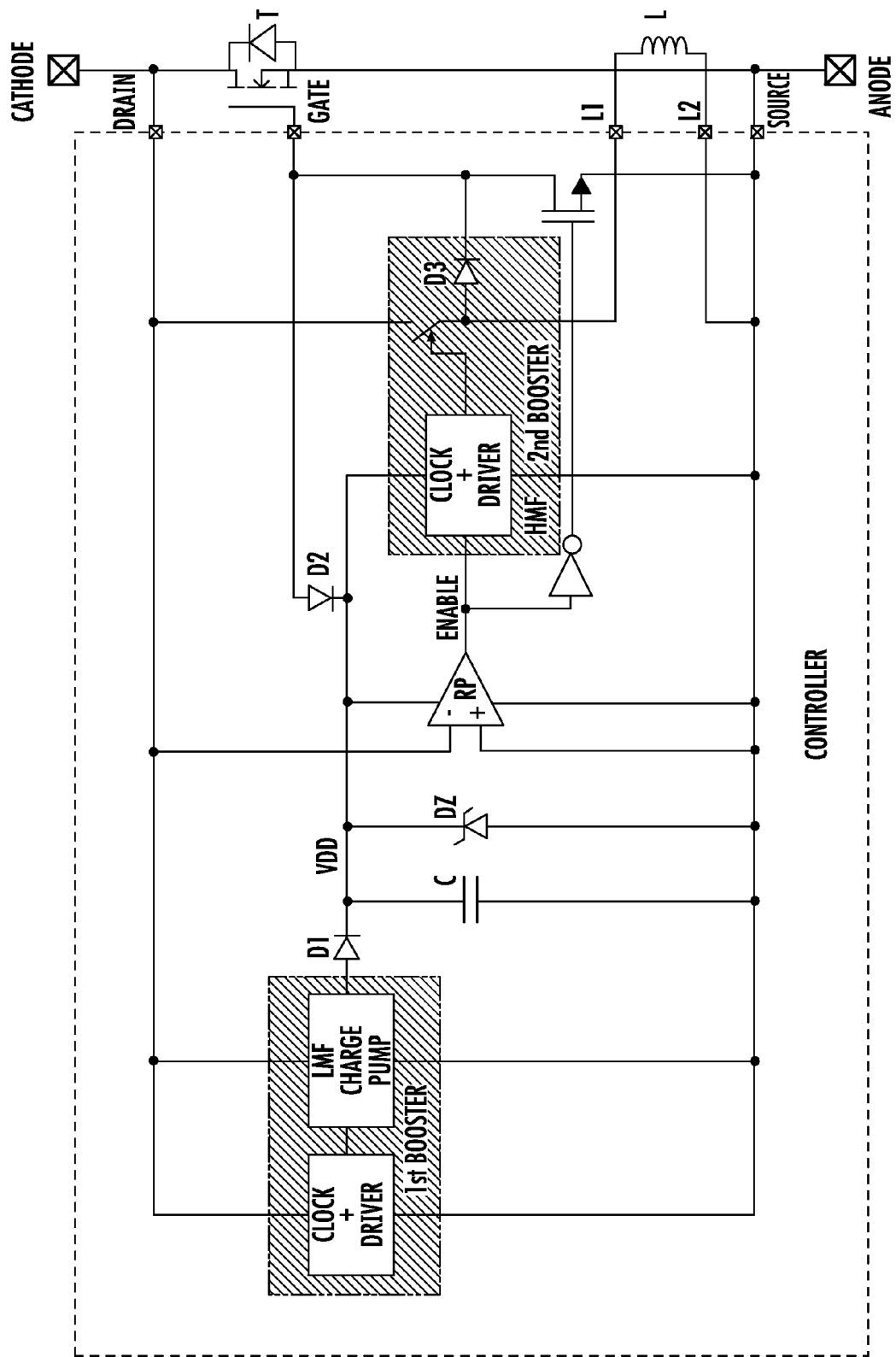
FIG. 3 is a schematic diagram illustrating an exemplary circuit embodiment of the inductive voltage booster circuit of the present disclosure.

An exemplary embodiment of the by-pass diode system-in-package device of this disclosure is depicted in FIG. 3. In the illustrated embodiment, the power switching component T is in the form of a discrete N-channel MOSFET power transistor T, the current terminals of which are connected, respectively, to anode and cathode leads of an external connection of the system-in-package device.

The state of the switching device T is controlled by an integrated control circuit contained inside the broken line perimeter that uses a discrete inductor L connected to the pads L1 and L2 of the integrated circuit to the other connection pads of which connect the source, the drain and the gate of the controlled discrete N-channel MOSFET.

A start-up voltage booster, $1^{st}$ BOOSTER, commonly including a common drive clock phases generating circuit and driver stage of a low multiplication factor charge pump circuit, that eventually becomes supplied by a negative drain/source voltage difference on the current terminals of the power MOSFET T, that may be caused by a current interruption occurring within the series connected DC source or multi-source string in parallel to the MOSFET (practically on the ANODE and CATHODE leads of the device) while other series connected DC source or multi-source string continue to generate DC current.

The start up voltage booster has the sole function of initially providing a sufficiently high supply voltage to the polarity inversion detecting comparator RP that senses the sign of the voltage difference present on the current terminals of the power switch T and therefore it is required to raise the voltage difference from about 300-500 mV to just about 2 V to activate the polarity inversion detecting comparator RP. The number of stages and the capacitance values required for implementing the LMF charge pump circuit are such to be easily implemented in integrated form on the semiconductor chip. Diode D1, tank capacitor C and the Zener diode DZ provide for a sufficiently stable supply voltage VDD and may protect the integrated charge pump circuit from over voltages.

The output state of the polarity inversion detector comparator RP controls the enablement and disablement of a high multiplication factor inductive HMF voltage booster, $2^{nd}$ BOOSTER, the output of which is directly connected to the control gate of the power switch T. Apart from a common clock signal generating oscillator and driver stage of an analog switch S. and output diode D3, the inductive booster utilizes a discrete inductor L connected to the pads L1 and L2 of the integrated control circuit, although multistage inductive booster stages (e.g. a two stage booster using two discrete inductors) could alternatively be implemented.

The second or main inductive voltage booster, $2^{nd}$ BOOSTER, has a multiplication factor adapted to boost the gate voltage to a value sufficiently high to turn on the MOSFET (upon detecting for example a by-pass requiring condition) and, most significantly, to maintain ON the MOSFET notwithstanding the fact that upon entering a conduction state, the negative drain/source voltage difference at its current terminals rapidly drops down to become equivalent to the voltage drop over the $R_{DS}$ of the conducting MOSFET, which for evident reasons of efficiency may be as low as feasible and according to state-of-the-art fabrication technologies may become just 50-100 mV.

In practice, the multiplication factor of the second booster should reach magnitudes of about 50×-100×, such to be able to maintain the gate of the MOSFET at an overdrive voltage of about 5V. These requisites have been found to be most efficiently satisfied by an inductive booster in consideration of the decisively smaller encumbrance of a discrete inductor of a few μH, compared to the considerable encumbrance of numerous discrete capacitors needed to implement an equivalent high multiplication factor charge pump circuit and the impracticality or large cost of integrating such numerous capacitances of adequate value. Overall, the inductive voltage booster has lesser ohmic losses and higher energy efficiency compared to a capacitive charge pump booster.

As observed in the circuit diagram of FIG. 3, the second inductive voltage booster, $2^{nd}$ BOOSTER, once enabled by the polarity inversion detecting comparator RP, sustains the powering of the associated clock generating and drive circuitry, as well as the polarity inversion detecting comparator RP through a supply line, including the protection diode D2, notwithstanding the fact that the integrated start up charge pump, $1^{st}$ BOOSTER, ceases to operate as soon as the MOSFET T turns ON because of the insufficiency of the extremely low residual negative drain/source voltage difference to supply its functional circuits.

As evident to the skilled artisan, the system-in-package, two-terminal device of this disclosure can be used in substitution of a traditional by-pass diode in solar panels and alike DC power collection/distribution networks as well as a safety circuit breaker to prevent damages from accidental polarity inversion of a battery powering a vulnerable circuitry or other electrical load.

That which is claimed is:

1. A diode-configured device for providing a current by-pass path of at least one circuit device, and comprising:
    a power switching MOSFET including current terminals to be coupled to the at least one circuit device to be by-passed, and a gate terminal;
    an in-package integrated circuit configured to control the gate terminal of the power switching MOSFET, and including
        a low multiplication factor (LMF) charge pump of a negative drain/source voltage difference on the current terminals of the MOSFET caused by a current interruption within the at least one circuit device to be by-passed,
        a reverse polarity sensing comparator configured to receive a supply voltage from the LMF charge pump and to sense the negative drain/source voltage difference on the current terminals of the MOS FET,
        at least one in-package discrete inductor,
        a high multiplication factor (HMF) inductive voltage booster enabled by the comparator and coupled to the at least one in-package discrete inductor, configured to apply an output boosted voltage to the gate terminal of the MOSFET for keeping it in conduction as long as the negative drain/source voltage difference is sensed by the comparator,
        the LMF charge pump ceasing to operate based upon the negative drain/source voltage difference decreasing to a voltage drop over the drain-source-resistance ($R_{DS}$) of the conducting MOSFET, and
        a protective diode configured to derive the supply voltage to the comparator and to the HMF inductive voltage booster from the output boosted voltage thereof.

2. The diode-configured device of claim 1, wherein the at least one circuit device comprises at least one DC source of a plurality of series connected DC sources subject to a momentary ceasing of DC power generation while other series connected DC sources continue to generate DC power.

3. The diode-configured device of claim 1, wherein the at least one circuit device comprises a battery powered device subject to polarity inversion of a battery, and the diode-configured device defining a safety circuit breaker for preventing damage to the battery powered device.

4. The diode-configured device of claim 1, wherein said power switching MOSFET comprises an in-package discrete device.

5. The diode-configured device of claim 1, wherein said power switching MOSFET is monolithically integrated together with said integrated circuit on a same semiconductor chip.

6. The diode-configured device of claim 1, wherein said at least one in.-package discrete inductor includes an inductance on the order of μH.

7. A device for providing a current by-pass path of at least one circuit device, and comprising:
    a power switching MOSFET including current terminals to be coupleld to the at least one circuit device to be by-passed, and a gate terminal;
    an integrated circuit configured to control the gate terminal of the power switching MOSFET, and including
        a low multiplication factor (LMF) charge pump of a negative drain/source voltage difference on the current terminals of the MOSFET,
        a reverse polarity sensing comparator configured to receive a supply voltage from the LMF charge pump and to sense the negative drain/source voltage difference on the current terminals of the MOSFET, and
        a high multiplication factor (HMF) inductive voltage booster enabled by the comparator, and configured to apply an output boosted voltage to the gate terminal of the MOSFET.

8. The device of claim 7, wherein the at least one circuit device comprises at least one DC source of a plurality of series connected DC sources subject to a momentary ceasing of DC power generation while other series connected DC sources continue to generate DC power.

9. The device of claim 7, wherein the at least one circuit device comprises a battery powered device subject to polarity inversion of a battery, and the device defining a safety circuit breaker for preventing damage to the battery powered device.

10. The device of claim 7, wherein said power switching MOSFET comprises an in-package discrete device.

11. The device of claim 7, wherein said power switching MOSFET is monolithically integrated together with said integrated circuit on a same semiconductor chip.

12. The device of claim 7, further comprising at least one in-package discrete inductor coupled to the HMF inductive voltage booster and including an inductance on the order of μH.

13. A method for providing a current by-pass path of at least one circuit device, and comprising:
    coupling current terminals of a power switching MOSFET to the at least one circuit device to be by-passed;
    coupling an integrated circuit to control the gate terminal of the power switching MOSFET, and including a low multiplication factor (LMF) charge pump of a negative drain/source voltage difference on the current terminals of the MOSFET, a reverse polarity sensing comparator configured to receive a supply voltage from the LMF charge pump and to sense the negative drain/source voltage difference on the current terminals of the MOSFET, and a high multiplication factor (HMF) inductive voltage booster enabled by the comparator, and configured to apply an output boosted voltage to the gate terminal of the MOSFET.

14. The method of claim 13, wherein the at least one circuit device comprises at least one DC source of a plurality of series connected DC sources subject to a momentary ceasing of DC power generation while other series connected DC sources continue to generate DC power.

15. The method of claim 13, wherein the at least one circuit device comprises a battery powered device subject to polarity inversion of a battery, and the device defining a safety circuit breaker for preventing damage to the battery powered device.

16. The method of claim 13, wherein said power switching MOSFET comprises an in-package discrete device.

17. The method of claim 13, wherein said power switching MOSFET is monolithically integrated together with said integrated circuit on a same semiconductor chip.

18. The method of claim 13, further comprising coupling at least one in-package discrete inductor to the IMF inductive voltage booster and including an inductance on the order of μH.

* * * * *